US011443886B2

(12) United States Patent
Yosui

(10) Patent No.: US 11,443,886 B2
(45) Date of Patent: Sep. 13, 2022

(54) MULTILAYER SUBSTRATE AND METHOD OF PRODUCING MULTILAYER SUBSTRATE

(71) Applicant: Murata Manufacturing Co., Ltd., Nagaokakyo (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 997 days.

(21) Appl. No.: 16/166,194

(22) Filed: Oct. 22, 2018

(65) Prior Publication Data

US 2019/0057802 A1 Feb. 21, 2019

Related U.S. Application Data

(63) Continuation of application No. PCT/JP2017/017775, filed on May 11, 2017.

(30) Foreign Application Priority Data

May 18, 2016 (JP) .............................. JP2016-099451

(51) Int. Cl.
*H01F 27/28* (2006.01)
*H05K 3/46* (2006.01)
(Continued)

(52) U.S. Cl.
CPC ......... *H01F 27/2804* (2013.01); *H01F 5/003* (2013.01); *H01F 41/041* (2013.01); *H05K 1/165* (2013.01); *H05K 3/0032* (2013.01); *H05K 3/46* (2013.01); *H05K 3/4644* (2013.01); *H01F 2027/2809* (2013.01); *H05K 1/0271* (2013.01);
(Continued)

(58) Field of Classification Search
CPC ............. H01F 17/0013; H01F 27/2804; H01F 2027/2809; H01F 17/0006; H01F 5/003; H05K 1/165; H05K 3/0032; H05K 3/4644; H05K 3/46; H05K 1/0271;
(Continued)

(56) References Cited

U.S. PATENT DOCUMENTS

2016/0055967 A1* 2/2016 Nishino .................. H01F 41/02
29/605

FOREIGN PATENT DOCUMENTS

JP          4-321295 A     11/1992
JP      2012070243 A *      4/2012
(Continued)

OTHER PUBLICATIONS

Official Communication issued in International Patent Application No. PCT/JP2017/017775, dated Aug. 15, 2017.

*Primary Examiner* — Tszfung J Chan
(74) *Attorney, Agent, or Firm* — Keating & Bennett, LLP

(57) ABSTRACT

A multilayer substrate includes a laminated body including thermoplastic resin layers, a conductor pattern, a level-difference eliminating through hole, and a thickness adjustment member. The conductor pattern is on a main surface of one of the resin layers and is in the laminated body. The level-difference eliminating through hole is located at a position different from the conductor pattern in a planar view of the laminated body and penetrates the resin layer in a thickness direction. The thickness adjustment member is made of the same material as the resin layers, is located in the through hole, and has a thickness greater than a thickness of the resin layer.

10 Claims, 8 Drawing Sheets

(51) Int. Cl.
*H01F 5/00* (2006.01)
*H01F 41/04* (2006.01)
*H05K 1/16* (2006.01)
*H05K 3/00* (2006.01)
*H05K 1/02* (2006.01)

(52) U.S. Cl.
CPC ... *H05K 3/4617* (2013.01); *H05K 2201/0129* (2013.01); *H05K 2201/09672* (2013.01); *H05K 2203/068* (2013.01); *H05K 2203/107* (2013.01)

(58) Field of Classification Search
CPC . H05K 2201/0129; H05K 2201/09672; H05K 2203/068; H05K 2203/107
USPC .................................................. 336/200, 232
See application file for complete search history.

(56) References Cited

FOREIGN PATENT DOCUMENTS

| | | |
|---|---|---|
| JP | 2012-99600 A | 5/2012 |
| JP | 5636842 B2 | 12/2014 |
| WO | 2015/129601 A1 | 9/2015 |

\* cited by examiner

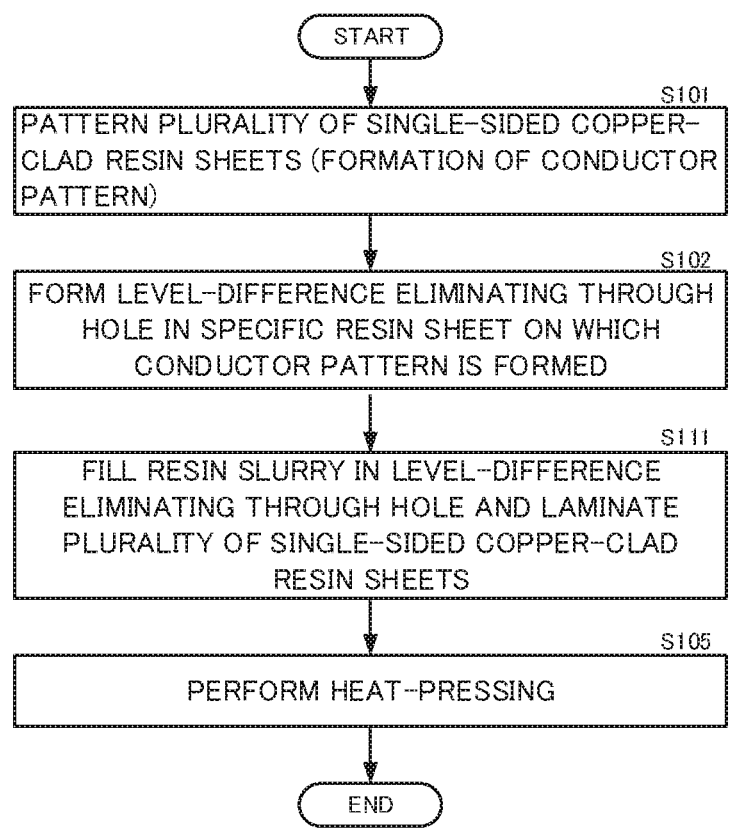

MULTILAYER SUBSTRATE AND METHOD OF PRODUCING MULTILAYER SUBSTRATE

CROSS REFERENCE TO RELATED APPLICATIONS

This application claims the benefit of priority to Japanese Patent Application No. 2016-099451 filed on May 18, 2016 and is a Continuation Application of PCT Application No. PCT/JP2017/017775 filed on May 11, 2017. The entire contents of each application are hereby incorporated herein by reference.

BACKGROUND OF THE INVENTION

1. Field of the Invention

The present invention relates to a multilayer substrate including a laminated body including a plurality of resin layers and a conductor pattern.

2. Description of the Related Art

As one kind of multilayer substrate, Japanese Patent No. 5636842 describes a multilayer antenna. The multilayer antenna of Japanese Patent No. 5636842 is formed by laminating a plurality of resin sheets having a conductor pattern for an antenna formed thereon and a buffer sheet having no conductor pattern formed thereon. A slit is formed in the buffer sheet.

The plurality of resin sheets and the buffer sheet are arranged so that the conductor pattern and the slit are overlapped in a planar view of the laminated state. Thus, the conductor pattern is laminated so as to be buried in the slit, thereby reducing or preventing a positional displacement between the conductor patterns arranged in a lamination direction.

However, when the resin sheet and the buffer sheet described in Japanese Patent No. 5636842 are thermoplastic resins, the plurality of resin sheets and the buffer sheet are heat-pressed in a laminated state. When the heat-pressing is performed, a flow of the buffer sheet occurs, and the positional relationship between the conductor pattern and the slit may be shifted due to the flow of the buffer sheet. In this case, the positional displacement of the conductor pattern may be caused.

SUMMARY OF THE INVENTION

Preferred embodiments of the present invention provide multilayer substrates that each of include a laminated body including a plurality of resin layers made of a thermoplastic resin and a conductor pattern therein, and prevent positional displacement of the internal conductor pattern therein.

A multilayer substrate according to a preferred embodiment of the present invention includes a laminated body, a first internal conductor pattern, a level-difference eliminating through hole, and a thickness adjustment member. The laminated body includes a plurality of resin layers made of a thermoplastic resin. The first internal conductor pattern is located on a main surface of a first resin layer included in the plurality of resin layers and is provided in the laminated body. The level-difference eliminating through hole is located at a position different from the first internal conductor pattern in a planar view of the laminated body and penetrates the first resin layer in a thickness direction. The thickness adjustment member is made of the same material as the plurality of resin layers, is located in the through hole, and has a thickness greater than a thickness of the first resin layer.

In this configuration, the level-difference eliminating through hole in a portion with no conductor pattern and the thickness adjustment member. adjust the thickness of the portion with no conductor pattern to reduce or eliminate the difference in thickness between the portion having no conductor pattern and a portion having a conductor pattern.

In a multilayer substrate according to a preferred embodiment of the present invention, it is preferable that the thickness adjustment member extends over the first resin layer and the first internal conductor pattern in a lamination direction of the plurality of resin layers.

In this configuration, both the first internal conductor pattern and the first resin layer are in contact with the thickness adjustment member in a side surface direction perpendicular or substantially perpendicular to the lamination direction of the laminated body. For this reason, the first internal conductor pattern and the first resin layer receive similar stress from the side surface direction during heat-pressing, such that the positional displacement of the first internal conductor pattern with respect to the first resin layer hardly occurs.

In a multilayer substrate according to a preferred embodiment of the present invention, the thickness adjustment member is preferably made of the same thermoplastic resin as the plurality of resin layers.

In this configuration, the state of the thickness adjustment member is the same as the state of the plurality of resin layers at the time of heat-pressing. This improves the effect of reducing the difference in thickness.

In a multilayer substrate according to a preferred embodiment of the present invention, it is preferable that the thickness of the thickness adjustment member is equal to a sum of the thickness of the first resin layer and a thickness of the first internal conductor pattern.

In this configuration, the difference in thickness is more reliably reduced.

A multilayer substrate according to a preferred embodiment of the present invention may further include a second internal conductor pattern located on a main surface of a second resin layer included in the plurality of resin layers and provided in the laminated body. The second resin layer is adjacent to the first resin layer in the lamination direction. The second internal conductor pattern includes a portion which is overlapped with the first internal conductor pattern in a planar view of the laminated body. The level-difference eliminating through hole is located at a position different from the second internal conductor pattern in a planar view of the laminated body and penetrates the first resin layer and the second resin layer. The thickness adjustment member has a thickness greater than a sum of the thickness of the first resin layer and a thickness of the second resin layer.

In this configuration, a first resin layer in which the first internal conductor pattern is located in the laminated body in the lamination direction and a second resin layer in which the second internal conductor pattern is located are provided, and one thickness adjustment member extends over the first resin layer and the second resin layer. This reduces or prevents the positional displacement between the first internal conductor pattern and the second internal conductor pattern due to the positional displacement between the thickness adjustment members, as compared with the case of using a plurality of thickness adjustment members.

In a multilayer substrate according to a preferred embodiment of the present invention, it is preferable that the thickness of the thickness adjustment member is equal to a sum of the thickness of the first resin layer, the thickness of the first internal conductor pattern, the thickness of the second resin layer, and a thickness of the second internal conductor pattern.

In this configuration, one thickness adjustment member extends over the first resin layer, the second resin layer, the first internal conductor pattern, and the second internal conductor pattern. Thus, the positional displacement between the first internal conductor pattern and the second internal conductor pattern is reduced or prevented more reliably.

In a multilayer substrate according to a preferred embodiment of the present invention, the first internal conductor pattern and the second internal conductor pattern may be linear conductors and may be connected by an interlayer connecting conductor extending in the lamination direction.

In this configuration, for example, a coil including the first internal conductor pattern and the second internal conductor pattern is provided. When used as the coil, the positional displacement between the first internal conductor pattern and the second internal conductor pattern is reduced or prevented, so that the characteristics of the coil are stabilized or improved.

Further, a multilayer substrate according to a preferred embodiment of the present invention may include a surface conductor pattern on a surface of a third resin layer defining a surface of the laminated body. The surface conductor pattern includes a portion which is overlapped with the first internal conductor pattern in a planar view of the laminated body. The thickness adjustment member has a thickness greater than the thickness of the first resin layer.

In this configuration, a first internal conductor pattern and a surface conductor pattern which are arranged in the lamination direction are provided, and the positional displacement between the first internal conductor pattern and the surface conductor pattern is more reliably reduced or prevented.

In a multilayer substrate according to a preferred embodiment of the present invention, it is preferable that the thickness of the thickness adjustment member is equal to a sum of the thickness of the first resin layer, the thickness of the first internal conductor pattern, and a thickness of the surface conductor pattern.

In this configuration, the positional displacement between the first internal conductor pattern and the surface conductor pattern is more reliably reduced or prevented.

In a multilayer substrate according to a preferred embodiment of the present invention, the first internal conductor pattern and the surface conductor pattern may be linear conductors and may be connected by an interlayer connecting conductor extending in the lamination direction.

In this configuration, for example, a coil including the first internal conductor pattern and the surface conductor pattern is provided. When used as the coil, the positional displacement between the first internal conductor pattern and the surface conductor pattern is reduced or prevented, so that the characteristics of the coil are stabilized or improved.

Further, a method of producing a multilayer substrate according to a preferred embodiment of the present invention includes the following steps. In the method of producing a multilayer substrate, an internal conductor pattern is formed on a main surface of a first resin layer made of a thermoplastic resin. In the method of producing a multilayer substrate, a level-difference eliminating through hole which penetrates the first resin layer in the thickness direction is formed at a position different from the internal conductor pattern in the first resin layer. In the method of producing a multilayer substrate, a plurality of resin layers made of a thermoplastic resin including the first resin layer is laminated so as to provide the internal conductor pattern in the laminated body, and a resin slurry is filled in the level-difference eliminating through hole to form the laminated body. In the method of producing a multilayer substrate, the laminated body is heat-pressed.

In this production method, the resin slurry is filled in the level-difference eliminating through hole before the heat-pressing. Therefore, the positional displacement of the internal conductor pattern is reduced or prevented.

According to preferred embodiments of the present invention, in multilayer substrates each including a laminated body including a plurality of resin layers made of a thermoplastic resin and a conductor pattern therein, it is possible to reduce or prevent positional displacement of the internal conductor pattern therein.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a flowchart showing a second method of producing the multilayer substrate according to a preferred embodiment of the present invention.

DETAILED DESCRIPTION OF THE PREFERRED EMBODIMENTS

Figure 1:
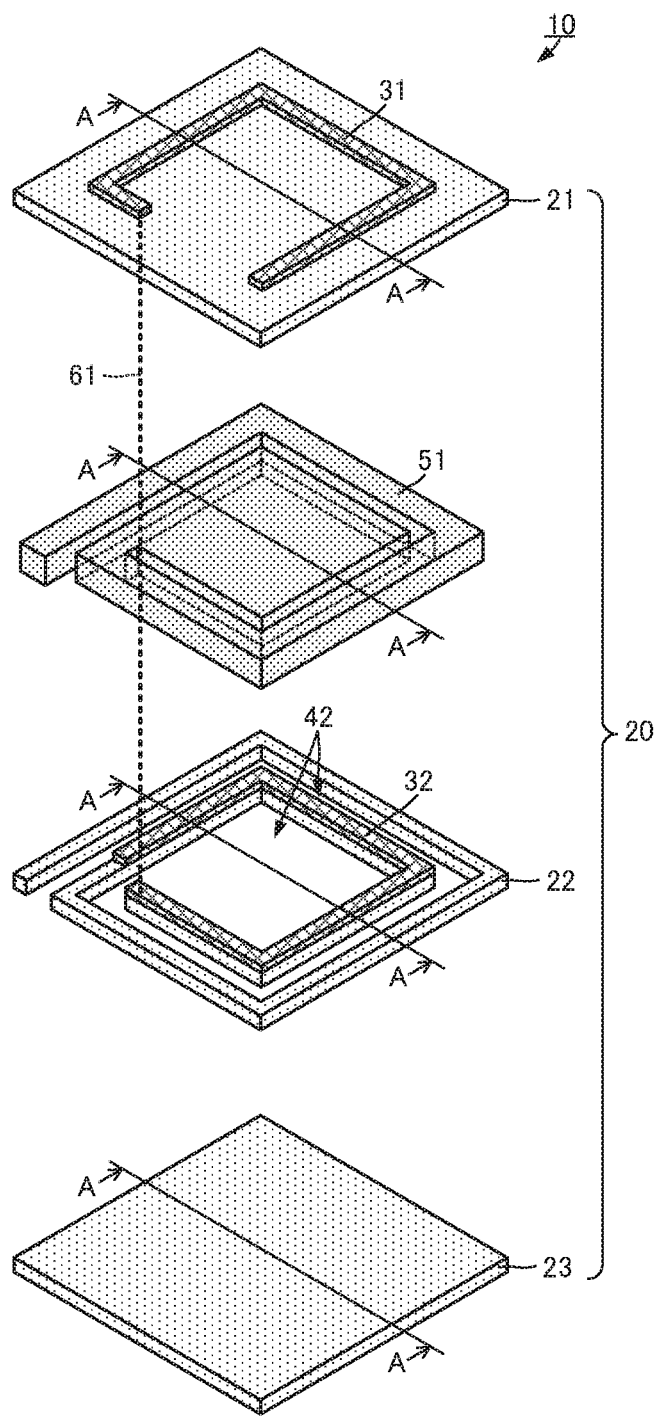
FIG. 1 is an exploded perspective view showing a main configuration of a multilayer substrate according to a first preferred embodiment of the present invention.
Figure 2:
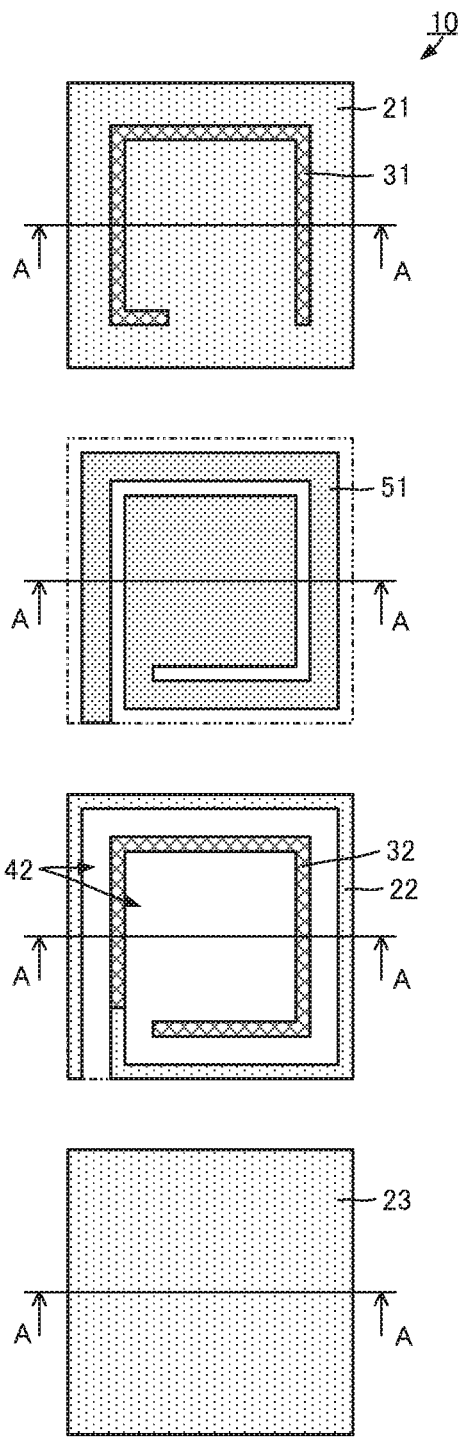
FIG. 2 is an exploded plan view showing the main configuration of the multilayer substrate according to the first preferred embodiment of the present invention.
Figure 3:
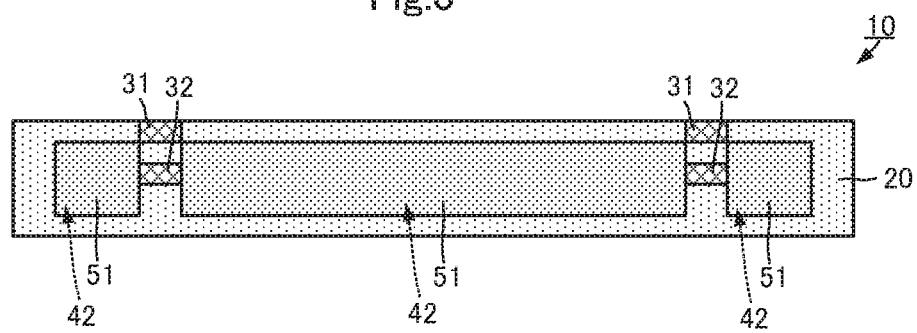
FIG. 3 is a cross-sectional view showing the main configuration of the multilayer substrate according to the first preferred embodiment of the present invention.

Multilayer substrates according to preferred embodiments of the present invention will be described with reference to the drawings. FIG. 1 is the exploded perspective view showing the main configuration of the multilayer substrate according to a first preferred embodiment of the present invention. FIG. 2 is the exploded plan view showing the main configuration of the multilayer substrate according to the first preferred embodiment of the present invention. FIG. 3 is the cross-sectional view showing the main configuration of the multilayer substrate according to the first preferred embodiment of the present invention.

As shown in FIGS. 1, 2, and 3, a multilayer substrate 10 includes a laminated body 20. The laminated body 20 includes a plurality of resin layers 21, 22, and 23. A thickness adjustment member 51 is provided in the laminated body 20. Each of the plurality of resin layers 21, 22, and 23 and the thickness adjustment member 51 is made of a thermoplastic resin and is made of the same material. For example, the plurality of resin layers 21, 22, and 23 and the thickness adjustment member 51 are made of a material containing a liquid crystal polymer as a main component.

The plurality of resin layers 21, 22, and 23 includes a first main surface and a second main surface opposed to each other. The plurality of resin layers 21, 22, and 23 are laminated. The second main surface of the resin layer 21 is in contact with the first main surface of the resin layer 22, and the second main surface of the resin layer 22 is in contact with the first main surface of the resin layer 23. The first main surface of the resin layer 21 is a surface of the laminated body 20, and the second main surface of the resin layer 23 is a back surface of the laminated body 20.

The laminated body 20 is preferably formed by arranging the thickness adjustment member 51 in the through hole 42 of the resin layer 22 to be described later, laminating the plurality of resin layers 21, 22, and 23, and heat-pressing these layers. The resin layer 22 corresponds to the "first resin layer". The resin layer 21 corresponds to the "third resin layer".

A conductor pattern 31 is provided on the first main surface (the surface of the laminated body 20) of the resin layer 21. The conductor pattern 31 is linear and includes a partially cut annular shape. The conductor pattern 31 corresponds to the "surface conductor pattern".

A conductor pattern 32 is provided on the first main surface of the resin layer 22. The conductor pattern 32 is linear and has a partially cut annular shape. In the state of the laminated body 20, the conductor pattern 32 is overlapped with the conductor pattern 31 over substantially the entire length in a linear extending direction. The conductor pattern 32 corresponds to the "first internal conductor pattern".

The through hole 42 which penetrates the resin layer 22 in the thickness direction is located in the resin layer 22. The through hole 42 is located in a portion different from the portion where the conductor pattern 32 is located on the resin layer 22. More specifically, in a planar view of the resin layer 22, the through hole 42 is formed of a portion which is located on the inner side of a ring defined by the conductor pattern 32 and a portion which extends along the conductor pattern 32. Thus, the through hole 42 is located so as to be adjacent to substantially the entire length of the conductor pattern 32 along the extending direction. The through hole 42 corresponds to the "level-difference eliminating through hole".

The thickness adjustment member 51 is provided in the through hole 42. Therefore, the thickness adjustment member 51 is located at a position extending over the conductor pattern 32 and the resin layer 22 in the lamination direction of the laminated body 20 (in a side view of the laminated body 20).

In a heat-pressed state, the shape of the thickness adjustment member 51 in a planar view is the same as or substantially the same as the shape of the through hole 42. Then, the thickness adjustment member 51 has a thickness greater than a length of the through hole 42 in a penetration direction, i.e., the thickness of the resin layer 22. In other words, the thickness adjustment member 51 extends over the resin layer 22 and the conductor pattern 32 in the lamination direction. Preferably, the thickness of the thickness adjustment member 51 is equal or substantially equal to the sum of the length of the through hole 42 in the penetration direction (i.e., the thickness of the resin layer 22) and a thickness of the conductor pattern 32. Further, the thickness of the thickness adjustment member 51 may be set to be equal or substantially equal to the sum of the length of the through hole 42 in the penetration direction (i.e., the thickness of the resin layer 22), the thickness of the conductor pattern 32, and the thickness of the conductor pattern 31. Therefore, even when the heat-pressing is performed, the movement of the conductor pattern 31 and the conductor pattern 32 due to the flow of the resin layers 21 and 22 is reduced or prevented, and as shown in FIG. 3, the positional displacement between the conductor pattern 31 and the conductor pattern 32 is reduced or prevented.

Particularly, in the conductor pattern 32, the thickness adjustment member 51 is located at the same position in the lamination direction, and the thickness adjustment member 51 extends over the resin layer 22 and the conductor pattern 32 in the lamination direction. Therefore, both the conductor pattern and the resin layer 22 are in contact with the thickness adjustment member 51 in a side surface direction perpendicular or substantially perpendicular to the lamination direction of the laminated body 20. For this reason, the conductor pattern 32 and the resin layer 22 receive similar stress from the side surface direction during heat-pressing. As a result, the movement of the conductor pattern 32 with respect to the resin layer 22 due to the flow of the resin is more reliably reduced or prevented, and the positional displacement of the conductor pattern 32 with respect to the resin layer 22 is reduced or prevented.

As a result, as shown in FIG. 1, when a spiral coil is defined by the conductor pattern 31, the conductor pattern 32, and an interlayer connecting conductor 61, it is possible to reduce or prevent changes in the characteristics of the coil. It is to be noted that the interlayer connecting conductor 61 extends in the lamination direction of the plurality of resin layers 21, 22, and 23, and is a conductor pattern which connects the conductor pattern 31 to the conductor pattern 32.

Particularly, the linear conductor patterns 31 and 32 are likely to move in a width direction (a direction perpendicular or substantially perpendicular to the extending direction). However, the through hole 42 and the thickness adjustment member of the present preferred embodiment are adjacent to substantially the entire length of the conductor patterns 31 and 32 along the extending direction. As a result, the movement of the conductor patterns 31 and 32 is reduced or prevented substantially over the entire length, and the positional displacement of the conductor patterns 31 and 32 is reduced or prevented substantially over the entire length. This makes it possible to more reliably reduce or prevent changes in the characteristics of a coil including the conductor pattern 31, the conductor pattern 32, and the interlayer connecting conductor 61.

Further, the thickness of the thickness adjustment member 51 in a heat-pressed state is equal or substantially equal to the sum of the thickness of the heat-pressed resin layer 22 in a portion where the conductor pattern 31 and the conductor pattern 32 are overlapped in a planar view of the multilayer substrate 10, the thickness of the conductor pattern 32, and the thickness of the conductor pattern 31. That is, in the laminated body 20, the through hole 42 is filled with the thickness adjustment member 51. Therefore, as shown in FIG. 3, the thickness of the portion where the conductor pattern 31 and the conductor pattern 32 are overlapped in the multilayer substrate 10 is the same as the thickness of the portion which is different from the conductor pattern 31 and the conductor pattern 32 in the multilayer substrate 10.

In order to easily and reliably realize such a shape, it is preferable that the thickness adjustment member 51 before heat-pressing has the following shape.

The outer shape of the thickness adjustment member 51 before heat-pressing in a planar view is substantially the same as the shape of the through hole 42 before heat-pressing and is smaller than the shape of the through hole 42 before heat-pressing. Accordingly, the thickness adjustment member 51 is able to be easily provided in the through hole 42.

The thickness of the thickness adjustment member 51 before heat-pressing is greater than the thickness of the resin layer 22 before heat-pressing, and is preferably equal or substantially equal to the sum of the thickness of the resin layer 22 before heat-pressing, the thickness of the conductor pattern 32, and the thickness of the conductor pattern 31. As a result, during heat-pressing, a portion of the thickness adjustment member (a portion projecting in the thickness direction from the through hole 42) flows in a gap defined when the thickness adjustment member 51 is provided in the through hole 42, and the flowing portion fills the gap of the through hole 42. As a result, the through hole 42 is filled with the thickness adjustment member while reducing or preventing unevenness of the multilayer substrate 10, and thus the positional displacement between the conductor pattern 31 and the conductor pattern 32 is reduced or prevented. It is to be noted that the thickness of the thickness adjustment member 51 before heat-pressing may be slightly larger than the sum of the thickness of the resin layer 22 before heat-pressing, the thickness of the conductor pattern 32, and the thickness of the conductor pattern 31.

It is to be noted that the conductor pattern 32 in the laminated body 20 is easily affected by the flow of the resin layer as compared with the conductor pattern 31 on the surface of the laminated body 20. Therefore, at least the movement of the conductor pattern 32 may be reduced or prevented. In this case, the thickness of the thickness adjustment member 51 before heat-pressing may be greater than the thickness of the resin layer 22 before heat-pressing.

Although the entire conductor pattern 31 is buried in the laminated body 20 in the above-described preferred embodiment shown in FIG. 3, a portion of the conductor pattern 31 in the thickness direction may project from the surface of the laminated body 20 or the entire conductor pattern 31 may protrude from the surface of the laminated body 20.

Figure 4:
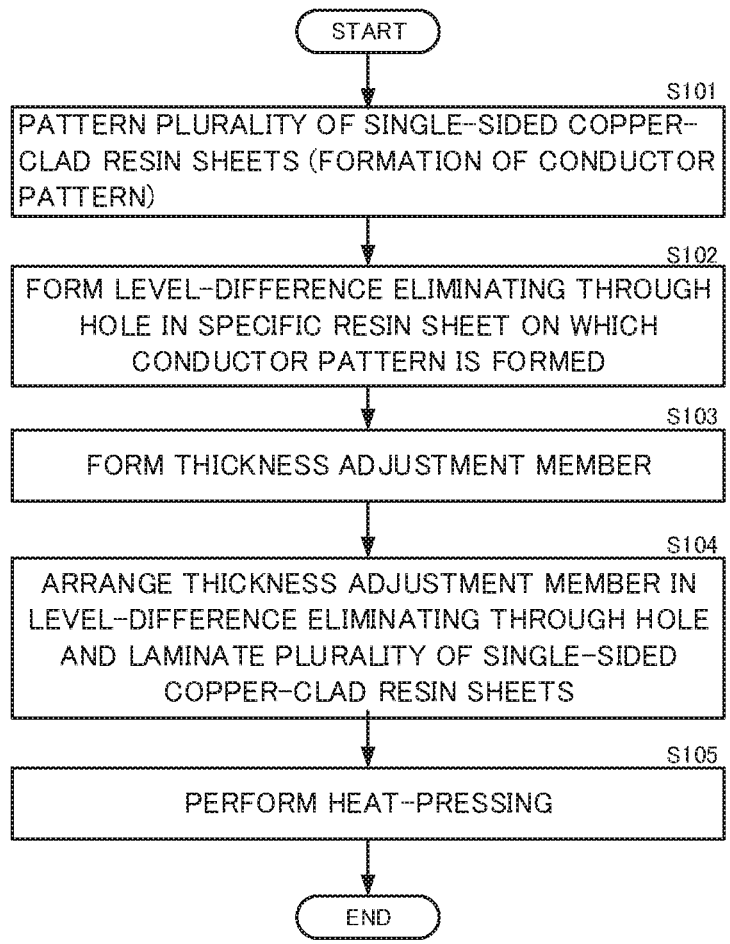
FIG. 4 is a flowchart showing a first method of producing the multilayer substrate according to a preferred embodiment of the present invention.

The multilayer substrate 10 having such a configuration is produced by the following non-limiting production method. FIG. 4 is a flowchart showing the first method of producing the multilayer substrate according to the present preferred embodiment of the present invention.

A plurality of single-sided copper-clad resin sheets formed by attaching a copper foil to one surface of a substrate made of a thermoplastic resin are patterned with a copper foil using a photolithography technique or the like (S101). As a result, the conductor pattern 31 of the resin layer 21 and the conductor pattern 32 of the resin layer 22 are formed.

A specific resin sheet on which the conductor pattern is formed, i.e., a resin sheet for forming the resin layer 22 is etched using a laser or the like to form a level-difference eliminating through hole 42 (S102).

The thickness adjustment member 51 is formed using the same material as the resin sheet for forming the resin layers 21, 22, and 23 (S103). The thickness adjustment member 51 is obtained by etching a portion other than the thickness adjustment member 51 with a laser or the like in a region having the same area as the resin layers 21, 22, and 23 of a flat resin sheet, for example. Alternatively, the portion other than the thickness adjustment member 51 may be punched out by punching or the like.

The thickness adjustment member 51 is arranged in the level-difference eliminating through hole 42, and a plurality of resin sheets for forming the resin layers 21, 22, and 23 are laminated (S104). Then, this laminated body is heat-pressed (S105). After the heat-pressing, the laminated body is cut into individual pieces to form the multilayer substrate 10.

By using the above production method, it is possible to easily produce a multilayer substrate in which the positional displacement of the conductor pattern is reduced or prevented.

In the above-mentioned production method, as shown in FIG. 2, it is preferable that a portion of the thickness adjustment member 51 reaches the outer shape of the resin layers 21, 22, and 23 in the flat resin sheet (see the two-dot chain line in FIG. 2). Thus, when a plurality of thickness adjustment members 51 are formed on one resin sheet, it is possible to connect the plurality of thickness adjustment members 51 and it is easy to produce the multilayer substrate 10 in a multi-shape.

It is to be noted that the method of producing the interlayer connecting conductor is not described in the above description, however, in general, a through hole for the interlayer connecting conductor is formed in the same step as the step of forming the level-difference eliminating through hole 42. Then, after filling a conductive paste of the through hole of the interlayer connecting conductor, the step S104 may be performed.

Figure 5:
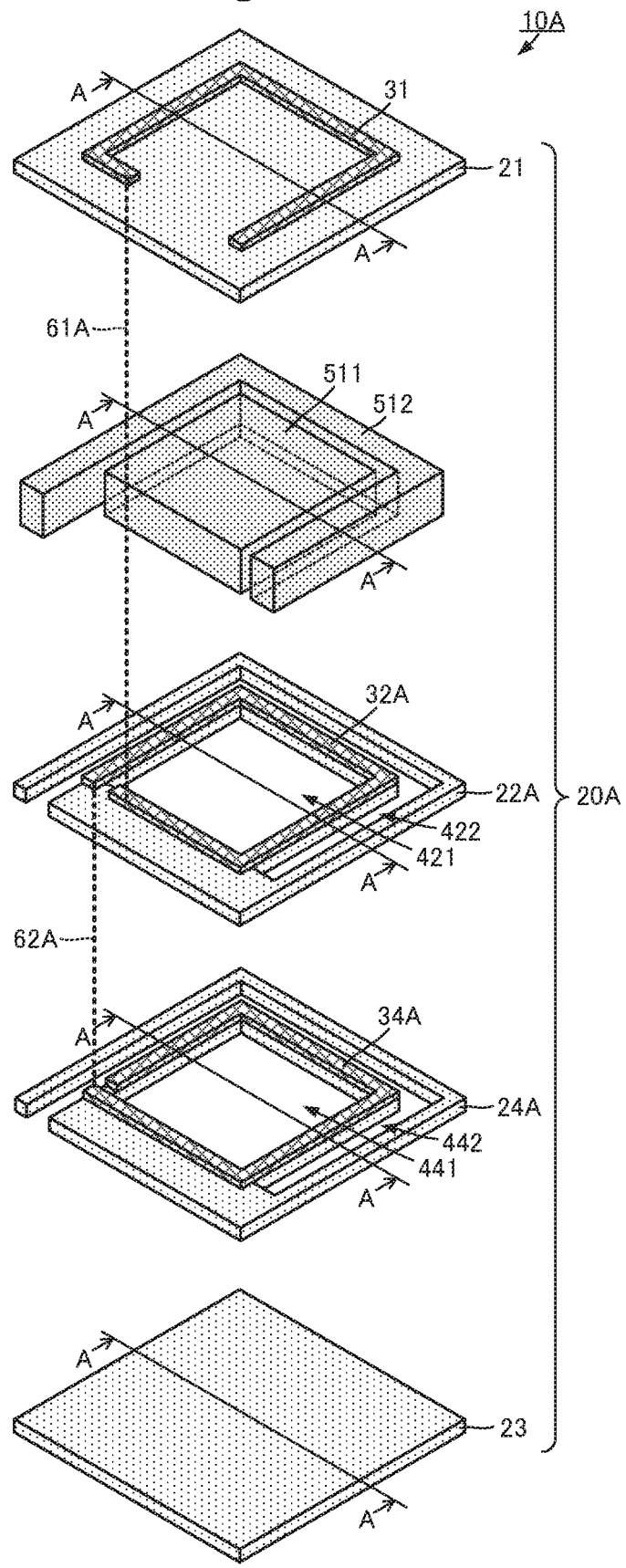
FIG. 5 is an exploded perspective view showing a main configuration of a multilayer substrate according to a second preferred embodiment of the present invention.
Figure 6:
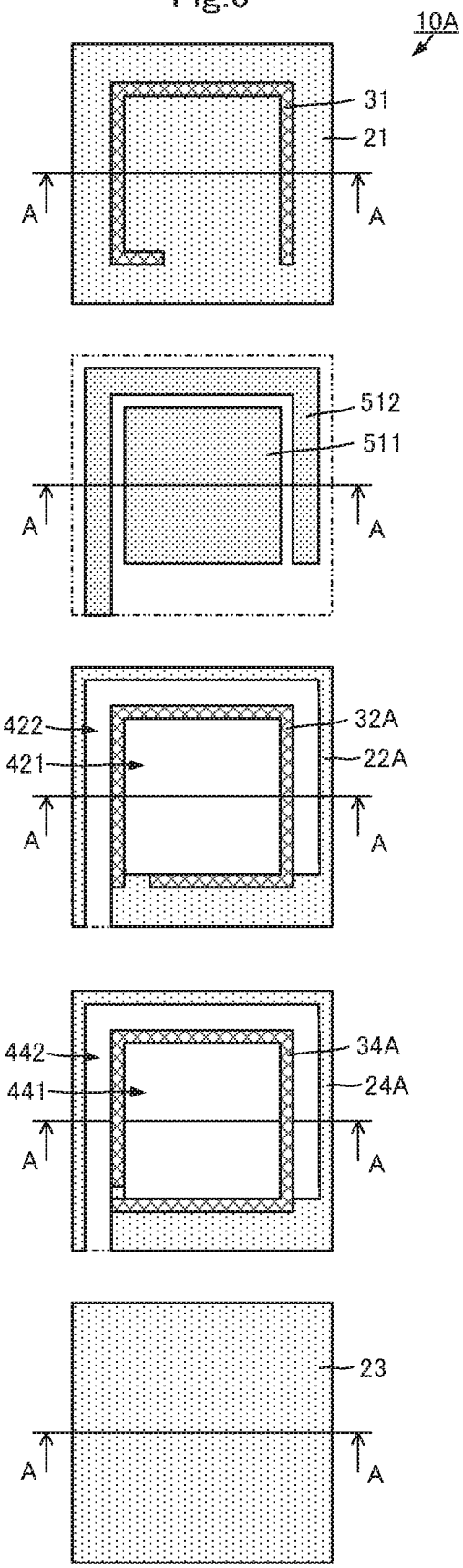
FIG. 6 is an exploded plan view showing the main configuration of the multilayer substrate according to the second preferred embodiment of the present invention.
Figure 7:
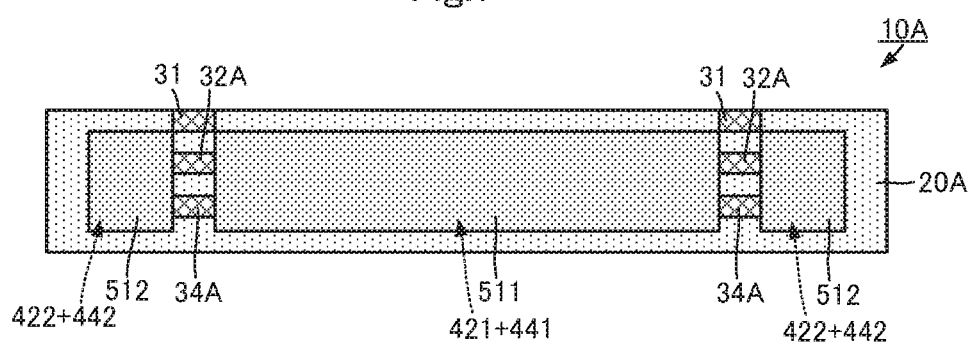
FIG. 7 is a cross-sectional view showing the main configuration of the multilayer substrate according to the second preferred embodiment of the present invention.

Subsequently, the multilayer substrate according to the second preferred embodiment of the present invention will be described with reference to the drawings. FIG. 5 is the exploded perspective view showing the main configuration of the multilayer substrate according to the second preferred embodiment of the present invention. FIG. 6 is the exploded plan view showing the main configuration of the multilayer substrate according to the second preferred embodiment of the present invention. FIG. 7 is the cross-sectional view showing the main configuration of the multilayer substrate according to the second preferred embodiment of the present invention.

A multilayer substrate 10A according to the present preferred embodiment is different from the multilayer substrate 10 according to the first preferred embodiment in that a resin layer 24A is added to the laminated body 20. Accordingly, the shape of each of the resin layer 22A and the thickness adjustment members 511 and 512 is also different from the shape of the multilayer substrate 10A according to the first preferred embodiment.

As shown in FIGS. 5, 6, and 7, the multilayer substrate 10A includes a laminated body 20A. The laminated body 20A includes resin layers 21, 22A, 23, and 24A. The thickness adjustment members 511 and 512 are provided in the laminated body 20A. The resin layers 21, 22A, 23, and 24A and the thickness adjustment members 511 and 512 are made of the same material. The resin layer 22A corresponds to the "first resin layer". The resin layer 24A corresponds to the "second resin layer". The resin layer 21 corresponds to the "third resin layer".

The laminated body 20A is formed by laminating the resin layer 21, the resin layer 22A, the resin layer 24A, and the resin layer 23 in this order from the surface side. The resin layers 21 and 23 are the same as the multilayer substrate 10 according to the first preferred embodiment.

A conductor pattern 32A is formed on the first main surface of the resin layer 22A. The conductor pattern 32A is linear and has a partially cut annular shape. In the state of the laminated body 20A, the conductor pattern 32A is overlapped with the conductor pattern 31 over substantially the entire length in the linear extending direction. The conductor pattern 32A corresponds to the "first internal conductor pattern".

Through holes 421 and 422 are formed in the resin layer 22A. The through hole 421 is located on the inner side of the ring formed by the conductor pattern 32A in a planar view of the resin layer 22A. The through hole 422 is located on the outer side between the conductor pattern 32A and the resin layer 22A in a planar view.

A conductor pattern 34A is formed on the first main surface of the resin layer 24A. The conductor pattern 34A is linear and has a partially cut annular shape. In the state of the laminated body 20A, the conductor pattern 34A is overlapped with the conductor patterns 31 and 32A over substantially the entire length in the linear extending direction. The conductor pattern 34A corresponds to the "second internal conductor pattern".

Through holes 441 and 442 are formed in the resin layer 24A. The through hole 441 is located on the inner side of the ring formed by the conductor pattern 34A in a planar view of the resin layer 24A. The shape of the through hole 441 in a planar view is substantially the same as the shape of the through hole 421. In the state of the laminated body 20A, the through hole 441 communicates with the through hole 421.

The through hole 442 is located on the outer side between the conductor pattern 34A and the resin layer 24A in a planar view. The shape of the through hole 442 in a planar view is substantially the same as the shape of the through hole 422. In the state of the laminated body 20A, the through hole 442 communicates with the through hole 422.

The thickness adjustment member 511 is provided in the through holes 421 and 441. Therefore, the thickness adjustment member 511 is located at a position extending over the resin layers 22A and 24A and the conductor patterns 32A and 34A in the lamination direction of the laminated body 20A (in a side view of the laminated body 20A). In a heat-pressed state, the shape of the thickness adjustment member 511 in a planar view is the same as the shape of the through holes 421 and 441.

A thickness adjustment member 512 is provided in the through holes 422 and 442. Therefore, the thickness adjustment member 512 is located at a position extending over the resin layers 22A and 24A and the conductor patterns 32A and 34A in the lamination direction of the laminated body 20A (in a side view of the laminated body 20A). In a heat-pressed state, the shape of the thickness adjustment member 512 in a planar view is the same as the shape of the through holes 422 and 442.

The thickness of the thickness adjustment members 511 and 512 before heat-pressing is greater than the sum of the thickness of the resin layer 22A before heat-pressing and the thickness of the resin layer 24A before heat-pressing, and is preferably the sum of the thickness of the resin layer 22A before heat-pressing, the thickness of the resin layer 24A before heat-pressing, the thickness of the conductor pattern 32A, and the thickness of the conductor pattern 34A. It is to be noted that the thickness of the thickness adjustment members 511 and 512 before heat-pressing may be slightly larger than the sum of the thickness of the resin layer 22A before heat-pressing, the thickness of the resin layer 24A before heat-pressing, the thickness of the conductor pattern 32A, and the thickness of the conductor pattern 34A.

In this configuration, similarly to the first preferred embodiment, the conductor patterns 32A and 34A and the resin layers 22A and 24A are in contact with the thickness adjustment members 511 and 512 in the side surface direction perpendicular or substantially perpendicular to the lamination direction of the laminated body 20A. For this reason, a similar stress is applied to the conductor patterns 32A and 34A and the resin layers 22A and 24A from the side surface direction during heat-pressing, such that the movement of the conductor patterns 32A and 34A with respect to the resin layers 22A and 24A due to the flow of the resin is reduced or prevented, and the positional displacement of the conductor patterns 32A and 34A with respect to the resin layers 22A and 24A is reduced or prevented. That is, even when two conductor patterns are provided in the laminated body 20A, it is possible to reduce or prevent the positional displacement of these conductor patterns. It is to be noted that even when the conductor pattern includes three or more layers, the positional displacement is able to be reduced or prevented by applying the same configuration. Further, the thickness adjustment members 511 and 512 extend over the conductor patterns 32A and 34A and the resin layers 22A and 24A such that there is no positional displacement between these members as compared with the case of the configuration including a member extending over the resin layer 22A and the conductor pattern 32A and a member extending over the resin layer 24A and the conductor pattern 34A, and the positional displacement of the conductor patterns 32A and 34A with respect to the resin layers 22A and 24A is more reliably reduced or prevented.

As a result, as shown in FIG. 5, when a spiral coil is defined by the conductor pattern 31, the conductor pattern 32A, the conductor pattern 34A, and the interlayer connecting conductors 61A and 62A, it is possible to reduce or prevent changes in the characteristics of the coil. It is to be noted that the interlayer connecting conductors 61A and 62A have a shape extending in the lamination direction of the plurality of resin layers 21, 22A, 24A, and 23. The interlayer connecting conductor 61A is a conductor pattern which connects the conductor pattern 31 to the conductor pattern 32A. The interlayer connecting conductor 62A is a conductor pattern which connects the conductor pattern 32A to the conductor pattern 34A.

In the above description, a process of forming the thickness adjustment member from a flat plate of the same material as the resin layer is shown, but a resin slurry may be used as the thickness adjustment member. FIG. 8 is a flowchart showing a second method of producing the multilayer substrate according to a preferred embodiment of the present invention. Hereinafter, a method of producing the multilayer substrate 10 according to the first preferred embodiment will be described.

Steps S101 and S102 are the same as the production method shown in FIG. 4, and a description thereof will be omitted.

The resin slurry is filled in the level-difference eliminating through hole 42, and a plurality of resin sheets for forming the resin layers 21, 22, and 23 are laminated (S111). In this case, the thickness of the resin slurry is set to be the same or substantially the same as the thickness of the thickness adjustment member of the flat plate. Then, this laminated body is heat-pressed (S105). The resin slurry is solidified by the heating during the heat-pressing and functions as the thickness adjustment member. After the heat-pressing, the laminated body is cut into individual pieces to form the multilayer substrate 10.

Even when the above production method is used, it is possible to easily produce a multilayer substrate in which the positional displacement of the conductor pattern is reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a laminated body including a plurality of resin layers made of a thermoplastic resin;
   a first internal conductor pattern located on a main surface of a first resin layer of the plurality of resin layers, and located in the laminated body;
   a level-difference eliminating through hole that is located at a position different from the first internal conductor pattern in a planar view of the laminated body and penetrates the first resin layer in a thickness direction; and
   a thickness adjustment member that is made of a same material as the plurality of resin layers, is located in the through hole, and has a thickness greater than a thickness of the first resin layer, the thickness adjustment member reduces a positional displacement of the first internal conductor pattern with respect to the first resin layer.

2. The multilayer substrate according to claim 1, wherein the thickness adjustment member extends over the first resin layer and the first internal conductor pattern in a lamination direction of the plurality of resin layers.

3. The multilayer substrate according to claim 1, wherein the thickness adjustment member is made of the same thermoplastic resin as the plurality of resin layers.

4. The multilayer substrate according to claim 1, wherein the thickness of the thickness adjustment member is equal or substantially equal to a sum of the thickness of the first resin layer and a thickness of the first internal conductor pattern.

5. The multilayer substrate according to claim 1, further comprising a second internal conductor pattern located on a main surface of a second resin layer of the plurality of resin layers and located in the laminated body; wherein
   the second resin layer is adjacent to the first resin layer in the lamination direction;
   the second internal conductor pattern includes a portion overlapped with the first internal conductor pattern in a planar view of the laminated body;
   the level-difference eliminating through hole is located at a position different from the second internal conductor pattern in the planar view of the laminated body and penetrates the first resin layer and the second resin layer; and
   the thickness adjustment member has a thickness greater than a sum of the thickness of the first resin layer and a thickness of the second resin layer.

6. The multilayer substrate according to claim 5, wherein the thickness of the thickness adjustment member is equal or substantially equal to a sum of the thickness of the first resin layer, the thickness of the first internal conductor pattern, the thickness of the second resin layer, and a thickness of the second internal conductor pattern.

7. The multilayer substrate according to claim 5, wherein the first internal conductor pattern and the second internal conductor pattern are linear conductors and are connected by an interlayer connecting conductor extending in the lamination direction.

8. The multilayer substrate according to claim 1, further comprising a surface conductor pattern on a surface of a third resin layer defining a surface of the laminated body; wherein
   the surface conductor pattern includes a portion overlapped with the first internal conductor pattern in a planar view of the laminated body; and
   the thickness adjustment member has a thickness greater than the thickness of the first resin layer.

9. The multilayer substrate according to claim 8, wherein the thickness of the thickness adjustment member is equal or substantially equal to a sum of the thickness of the first resin layer, the thickness of the first internal conductor pattern, and a thickness of the surface conductor pattern.

10. The multilayer substrate according to claim 8, wherein the first internal conductor pattern and the surface conductor pattern are linear conductors and are connected by an interlayer connecting conductor extending in the lamination direction of the plurality of resin layers.

* * * * *